United States Patent [19]

Marx

[11] 4,190,890

[45] Feb. 26, 1980

[54] PROGRAMMABLE LIGHT DIRECTOR SYSTEM

[75] Inventor: Warren G. Marx, Smithtown, N.Y.

[73] Assignee: Grumman Aerospace Corporation, Bethpage, NY

[21] Appl. No.: 852,076

[22] Filed: Nov. 16, 1977

[51] Int. Cl.[2] ...................... H05K 13/00; G06F 15/20

[52] U.S. Cl. ...................................... 364/491; 29/720; 29/748

[58] Field of Search .................. 364/491; 29/720, 721, 29/739, 748, 755; 33/278-280; 356/2

[56] References Cited

U.S. PATENT DOCUMENTS

| | | | |
|---|---|---|---|
| 2,805,471 | 9/1957 | Lowden | 29/203 MW X |
| 3,052,842 | 9/1962 | Frohman et al. | 29/407 UX |
| 3,169,305 | 2/1965 | Gray | 29/407 X |
| 3,407,480 | 10/1968 | Hill et al. | 29/203 MW |
| 3,440,531 | 4/1969 | Jasorka et al. | 29/203 MW X |
| 3,564,692 | 2/1971 | Knoll et al. | 29/720 X |
| 3,623,066 | 11/1971 | Norris | 29/203 MW X |
| 3,705,347 | 12/1972 | Tuller | 29/203 MW X |
| 3,706,134 | 12/1972 | Sweeney et al. | 29/203 MW X |
| 3,863,319 | 2/1975 | Pellet | 29/203 MW |
| 3,913,202 | 10/1975 | Pyle et al. | 29/721 |

*Primary Examiner*—Jerry Smith
*Attorney, Agent, or Firm*—Morgan, Finnegan, Pine, Foley & Lee

[57] ABSTRACT

A dual axis, laser powered light director system for routing wire of electric harnesses includes a laser light source carried on a carriage which is moved longitudinally of a wire harness assembly board. The laser light beam is directed to a rotatable mirror which directs the light beam transversely of the harness board. The movement of the carriage and mirror are computer controlled to move the light beam along a sequence of node points to form a continuous wire path for each wire in the harness. A machine readable code wand scanner serves as a communication interface between an operator and computer controls for purposes of wire identification.

21 Claims, 9 Drawing Figures

PROGRAMMABLE LIGHT DIRECTOR SYSTEM

FIELD OF INVENTION

The present invention relates to the field wire harness fabrication and more particularly to wiring assistance devices for wire harnesses.

BACKGROUND

A wire harness is an assembly of multiple wires which have been cut to appropriate lengths and equipped with terminals. The harness is bundled to provide a pre-assembled package of wires for incorporation into a device such as a computer, aircraft or other electronic instrument.

Depending on the complexity of the device, the wire harness may have any number of wires. For example, in a fighter aircraft, wire harness containing several hundreds or thousands of wires of different lengths, sizes and terminal configurations may be present.

A wire harness is fabricated manually so that the cost of fabrication increases dramatically with the number and complexity of wires within the harness. Traditionally, the harness was prepared from a wire harness drawing positioned on a work board on which each wire position and path were drawn. The operator would place each wire in position one at a time until the harness was completed.

With increases in harness complexity, the identification, location and placement of each wire on the harness board required some type of operator assistance to hold or reduce the increase in fabrication cost.

Several proposals have been made for wire assistance mechanisms. Lowden, U.S. Pat. No. 2,805,471, discloses the sequential projection of a single complete wire path onto a harness board from a projector having a transparency print of the wire path.

Computer assisted or other programmed light sequencing systems for wire harness fabrication are disclosed in:

Tuller—U.S. Pat. No. 3,705,347
Frohman et al.—U.S. Pat. No. 3,052,842
Gray—U.S. Pat. No. 3,163,926
Hill et al.—U.S. Pat. No. 3,407,480
Norris—U.S. Pat. No. 3,623,066
Jasorka et al.—U.S. Pat. No. 3,440,531
Sweeney et al.—U.S. Pat. No. 3,706,134

Other types of assistance devices and methods are disclosed in the following prior art:

Pellet—U.S. Pat. No. 3,863,319
Gray—U.S. Pat. No. 3,169,305
Logan—U.S. Pat. No. 3,693,228

Notwithstanding the various proposals in the prior art, a need exists for a more flexible system of wire laying assistance.

SUMMARY OF THE INVENTION

The programmable light director represents a system by which any given wire within an electrical harness assembly can be automatically identified and through the use of a 2-axis numerically controlled light source the proper path can be displayed in a continuous path fashion from beginning to end on a harness assembly board.

Wire recognition is accomplished through the use of bar coded identification tags which can be automatically read with a wand tape scanner. The wand scanner has a serialized data interface with a central processor unit (CPU) containing the continuous path information necessary to direct the light source. The CPU recognizes which wire has been scanned and performs the appropriate function. The following example illustrates a typical function for routing wires from a head connector having a plurality of wires to be routed:

A preassembled head connector is selected by the person who will route the wires. Any wire within the connector is scanned. The computer recognizes which wire has been selected and drives the light device to the start point of this wire group. The head connector is secured manually to the board, wire bundles are unrolled, and a wire is selected and scanned. Recognition of the wire is accomplished by the CPU. The operator depresses a continue button when ready, and the light device traces out the appropriate continuous path to its termination at which time it waits. The operator manually routes the wire along the path traced by the light beam. The operator, when wire routing is complete, selects continue or end depending upon whether the wire group has been completed. Seeing a continue signal the CPU checks the wire off an internal check list and if additional wires remain the light direction returns to the head connector to initialize another wire path trace. If all wires from a given head connector are complete, the end signal will cause the light detector to return to a predetermined kit location. The checklist feature insures that all wires will be accounted for and routed within an electrical harness.

A feature of the light director system is that the need for operator interpretation of identification and decision making is virtually eliminated thereby allowing maximum energies to be devoted exclusively to laying in wires.

The light director, a 2-axis system, is programmed by a three pass procedure. The three passes consist of: (1) a digitizing operation whereby discrete points are defined in terms of coordinates, (2) a definition of discrete paths in terms of subscripted points, and (3) a definition of wire number to a discrete path. Programming is accomplished through utilization of wire path drawing or preassembled wire path data.

Starting with a copy of a harness board drawing, the opeator sequentially assigns a number to each of the breakouts and end points along each wire path. The numbers represent discrete points which can be assembled into a string of points or path. Once the harness board drawing has been sequentially numbered, it is ready for digitizing or path development.

Digitizing is a technique by which coordinates are assigned to points using manual placement and the "reading" in of coordinates by the CPU. Sequentially the light beam is moved to each point. When the beam is at the desired location the operator depresses an enter data command and coordinates are then assigned to that point. The displayed point would now be incremented and the next coordinates assigned until all were complete. At this time all data points and associated coordinates would be stored in the CPU and the digitizing process or pass #1 would be complete.

Once all points have been sequentially numbered for digitizing, path definitions can also be established. Working from a pre-determined data base, a discrete path listing is generated which assigns the appropriate points to wire paths from which a punch tape is produced. The data base contains wire groups, from reference designation, and to reference designation. Upon loading the tape, the CPU complies the path and point definitions into path names and continuous path coordinates. Pass #2 is now complete.

Pass #3 is a data base, which relates wire number to path route. This wire number-path route data base is loaded directly into the CPU. The system is then ready to identify and direct the routing of any wire selected onto the harness board.

DETAILED DESCRIPTION

Figure 1:
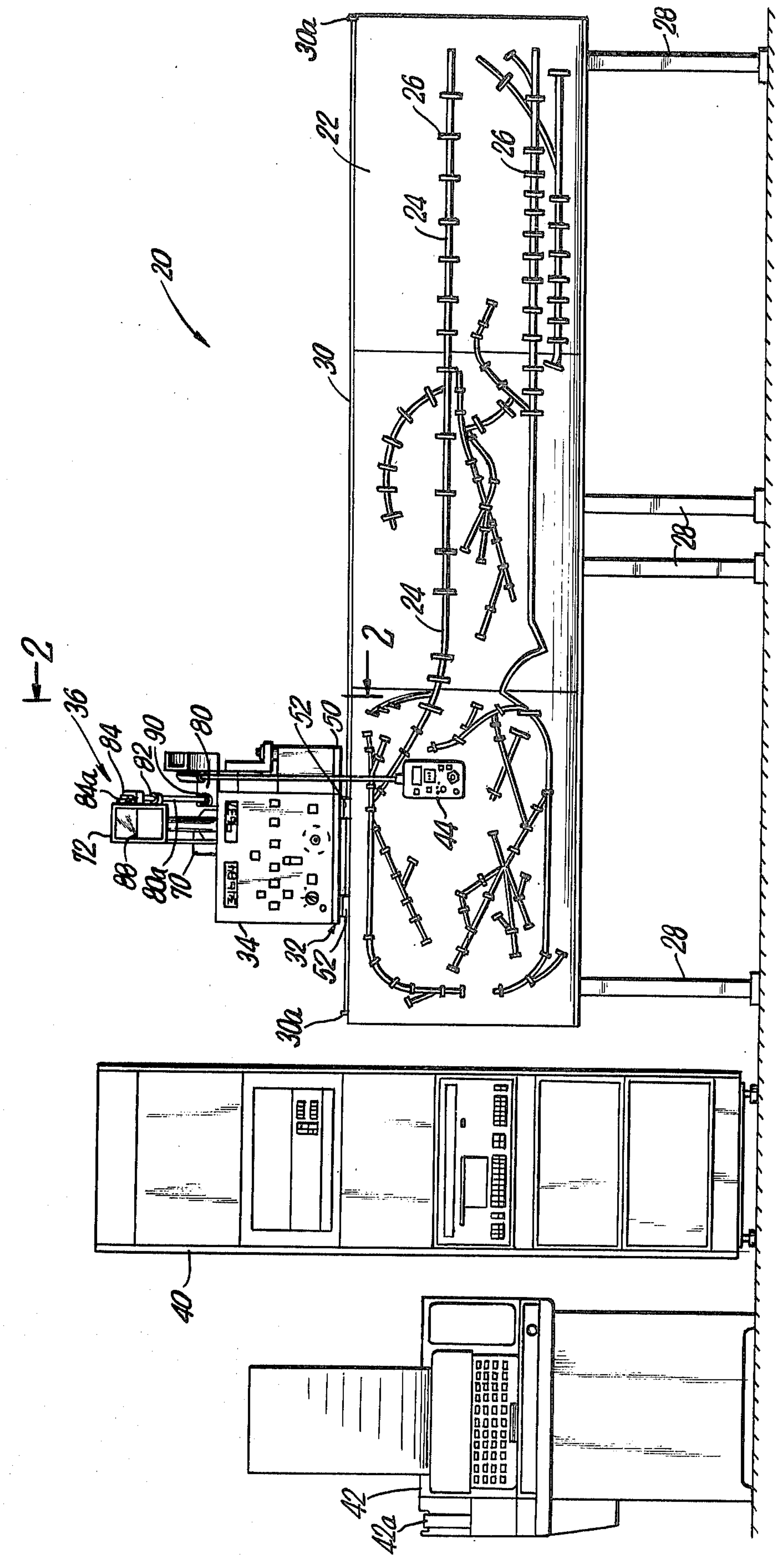
FIG. 1 is an elevation view illustrating the harness table and programmable light director system of the present invention.

While this invention is susceptible of embodiment in many different forms, there is shown in the drawings and will hereinafter be described in detail a preferred embodiment of the invention, with the understanding that the present disclosure is to be considered as an exemplification of the principles of the invention and is not intended to limit the invention to the embodiments illustrated.

INTRODUCTION

The overall programmable light director system (PLD) 20 is shown in FIGS. 1-4. The PLD is designed to automatically identify and through the use of a two-axis numerically controlled light source display a continuous moving light path from start to end of the identified wire on the harness board.

Figure 5:
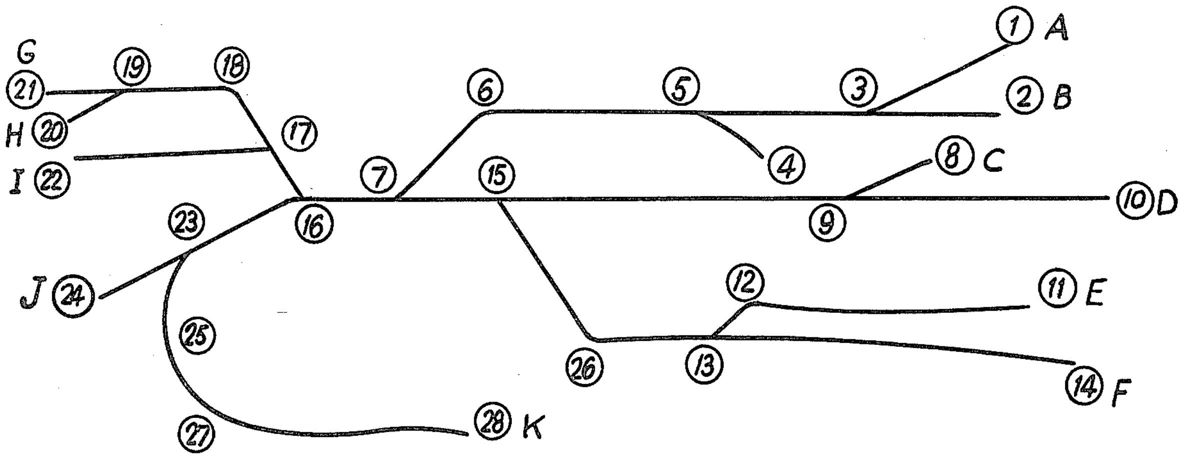
FIG. 5 is an illustrative harness path with labelled break-out points and end point nodes.

The major mechanical components of the PLD include a generally rectangular shaped harness board 22 carrying the harness wire path pattern 24 and wire supports 26 for holding the wires on the board. The harness pattern illustrated in FIGS. 1 and 5 are illustrative only since any pattern may be used with the system. The board 22 is supported on legs 28 at a height convenient for the assembler to reach. Additionally, the board 22 is angled from bottom to top, see FIG. 2.

To increase the utility of the system, it is advantageous to use two harness boards arranged in back-to-back relationship and angled in opposite directions. In this manner, while one board is being used in PLD system, the other board may be readied.

Adjacent the top of board 22 is a longitudinally extending rod 30 which acts as a track for guiding a carriage 32. The carriage 32 carries a main console 34, and laser light assembly 36 which generates a light spot on the board surface, as described below.

The other major components of the system include a computer system 40, such as a Digital Equipment Corp. PDP 8/E computer, with 16K of core memory and RK 8-E disk cartridge system 40*a* for controlling the PLD; a teletype input terminal 42 with paper tape data transfer 42*a*, such as ASR 33 Teletype sold by the Teletype Corp. for input and output to computer 40.

Input to the PLD is also provided through a digitized control box 44 and a pen reader 46, as described below.

PLD Carriage

Carriage 32 includes a base plate 50 for supporting console 34 and light assembly 36. A pair of open linear bearings 52 depending from the bottom front edge of plate 52 slidably engage rod 30 to provide a guide track for the carriage. Rod 30 is supported from the board frame at its ends 30*a* and at spaced locations along its length by supports which pass through the open area in bearing 52 as the carriage transverses the rod.

Carriage 32 is transported longitudinally (X-axis) by a drive motor 55 which is mounted on a weldment 56 depending from plate 50. Motor 55 is a stepper motor which takes 200 steps per shaft revolution; such motors are available from Sigma Corp., model 20-4266-TD 200-FO 6. The output shaft 55*a* couples with an X-axis encoder 58 which provides carriage location information to computer 40. A suitable X-axis encoder is sold by Dynamic Research Corp., model 29-21-BO3-200.

The terminal end of output shaft 55*a* carries a pinion 60 which meshes with a longitudinally extending rack 62 carried on the board frame member 64. The stepper motor 55 and pinion 60 are geared to produce approximately 0.0199 inch of linear motion for each step input to the motor. Thus, by driving stepper motor 55, the carriage is transported to the right or left, as viewed in FIG. 1 by the rack 62 and pinion 60 drive system, and the relative position of the carriage to the board is provided by encoder 58.

Preferably, the main console 34 and light assembly 36 are mounted on a horizontal swivel plate which is interconnected and lockable in the position shown in FIG. 1 and a position 180° removed for access by the second board arranged in back-to-back relationship. The swivel device is locked and unlocked through handle 65.

Laser Assembly

The light spot of the PLD is generated by a laser assembly 36 which directs a light beam B from laser 70 along an upwardly inclined path through a square tubular housing 72 to a rotatable mirror 74. Mirror 74 reflects the light beam downwardly onto the surface of board 22.

Laser 70 includes a low power HeNe Laser and beam expanding collimator. A suitable laser assembly is available from C.W. Radiation Inc. Laser model S-100, 0.5 mW, TEM n m, in conjunction with a Model T-105, 5X beam-expanding collimator.

Figure 2:
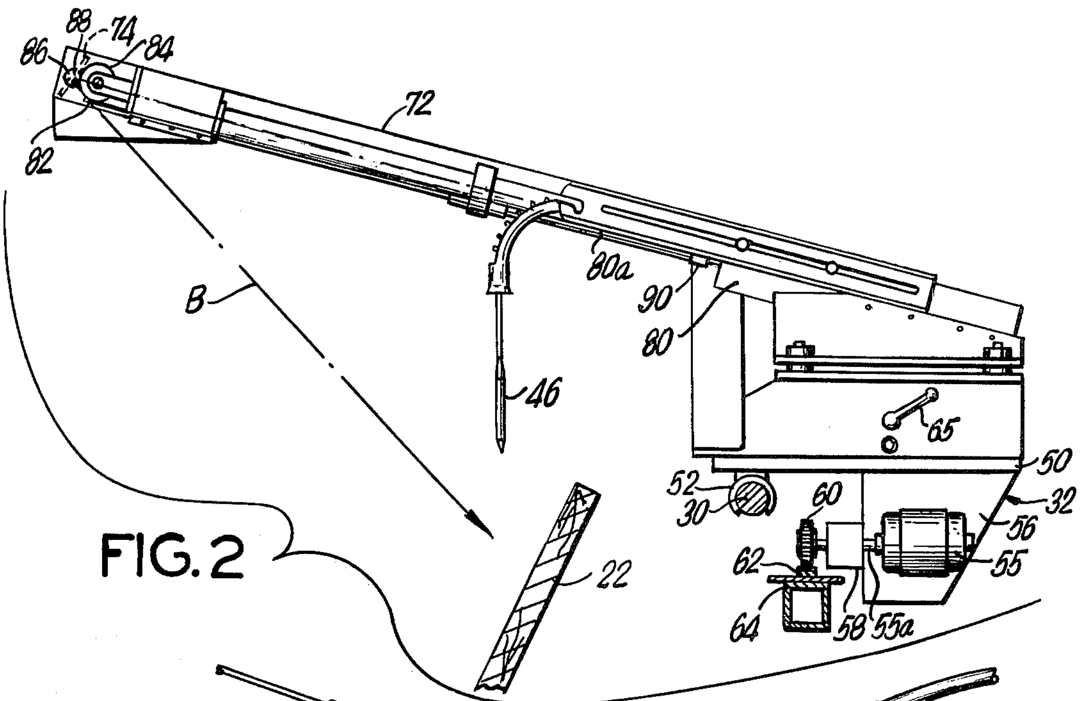
FIG. 2 is an enlarged cross-sectional view taken generally along line 2—3 in FIG. 1 with the harness table removed for clarity of illustration.

The transverse position of the beam B is controlled by mirror 74 and an angular (alpha) drive system which includes a stepper motor 80, whose elongated drive shaft 80*a* extends along the outside of tubular housing 72 and carries a worm gear 82 at its free end, see FIGS. 1 and 2. Worm gear 82 meshes with a composite reduction gear 84 and pinion 84*a*. Pinion 84*a* in turn meshes with a gear 86 mounted on the end of a journaled shaft 88 in the end of tube 72. Shaft 88 carries mirror 74 so that rotation of gear 86 causes conjoint rotation of mirror 74 to produce alpha or angle beam position control.

Motor 80 is also a 200 steps per revolution motor and is geared to produce approximately 0.022454 degree of mirror rotation per step. Motor 80 is of the type sold by Sigma Corp. as alpha axis motor model 20-2215-D200-F1.5B.

The drive shaft 80*a* of stepper motor 80 is coupled to an encoder 90 to provide angular position data to the control computer 40. Encoder 90 is of the type available from Dynamic Research Corp. as model 77-4-011-200 SV alpha axis encoder.

Control System

Figure 7:
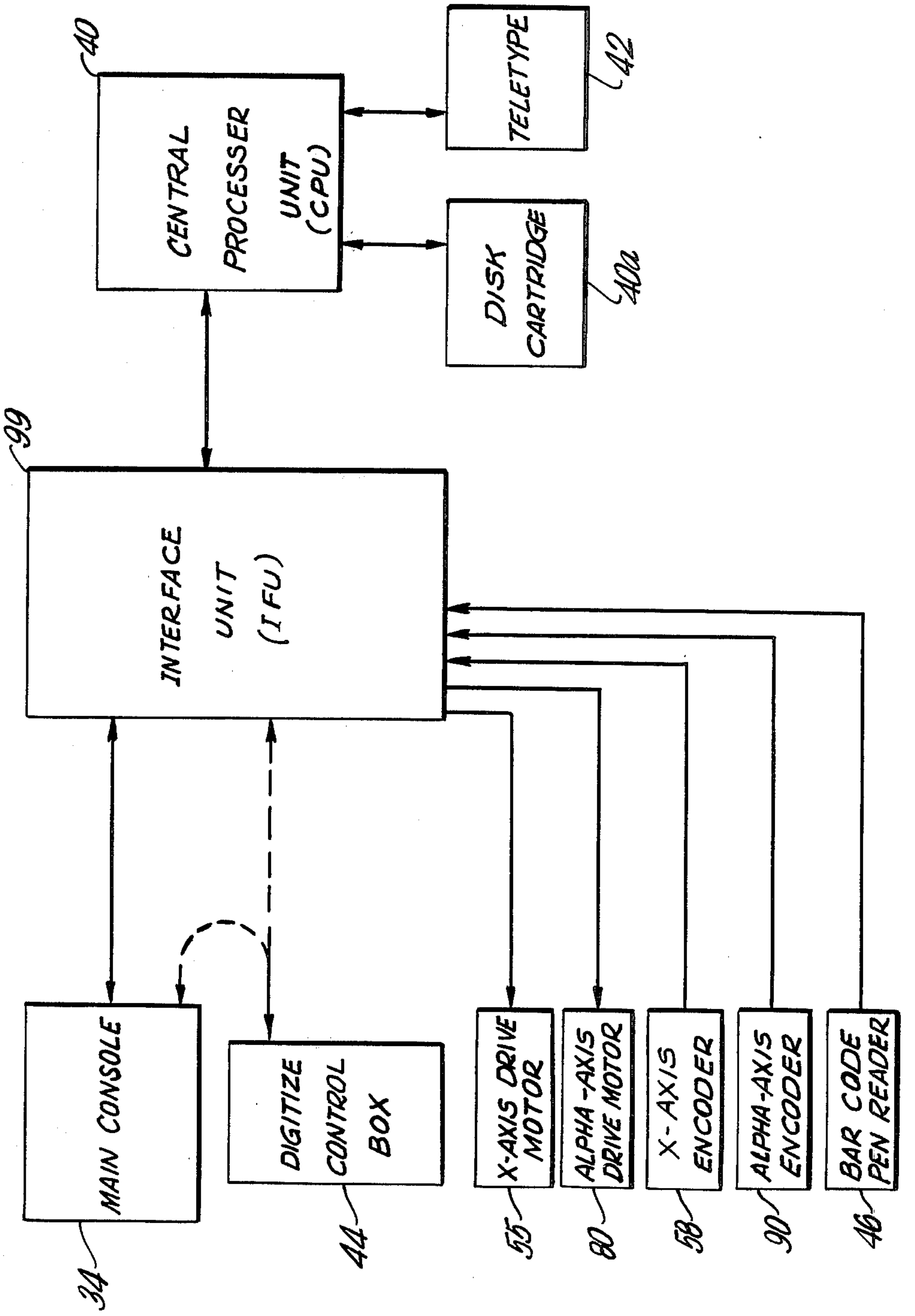
FIG. 7 is a block diagram of the system components illustrating the control flow paths.

The control system for the PLD is shown schematically in FIG. 7. The system includes central process computer 40 with input and output to disc cartridge 40*a* and teletype 42. The CPU 40 is linked to an interface unit (IFU) 99 which contains the control and interface logic for the peripheral equipment as well as the power supplies for the PLD system.

The peripheral equipment includes the main console 34, digitizing control box 44, X-axis drive motor 55, and X-axis encoder 58; alpha-axis drive motor 80, alpha-axis encoder 90, and bar code reader 46.

Main console 34 contains the control circuitry necessary for the operator to issue commands to the computer 40 for set-up and wire routing as described below, while the digitizing control box 44 is a remote control for inputing to the computer during the digitizing operation described below.

Figure 3:
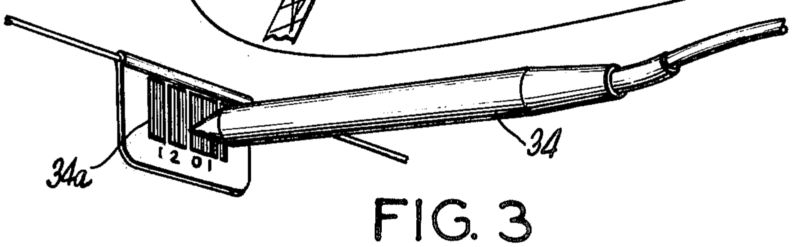
FIG. 3 is a perspective view illustrating a bar coded wire and pen reader utilized for identifying wires to the system.
Figure 4:
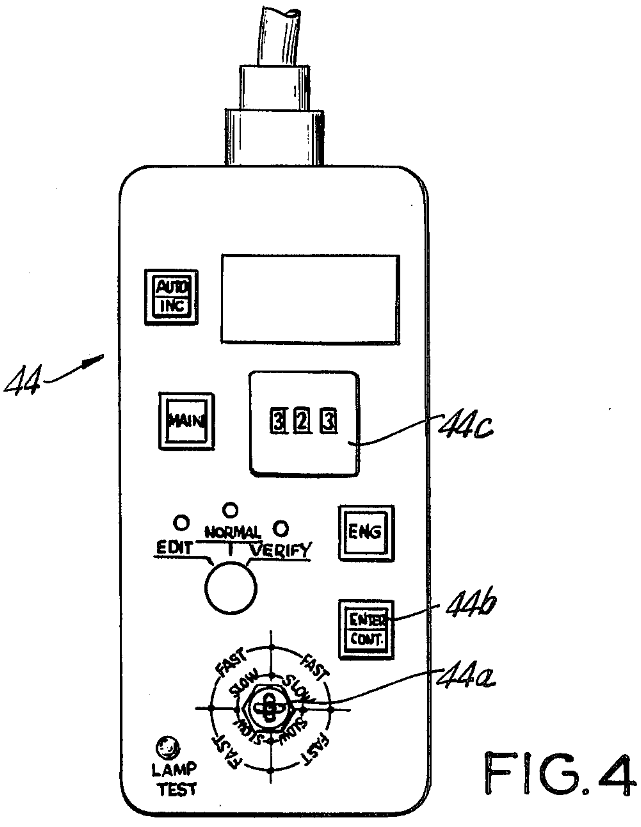
FIG. 4 is a front elevation view of the digitizing control system.

The bar code pen reader 46 is utilized to identify each wire tag from a bar coded symbol 34*a*, FIG. 3, and transmit the identification to the computer 40. A suitable bar code reader is of the type sold by Identicon Corp. Model 610 pen reading system.

Harness Board Programming

Each different harness board has a different number of wires and wire paths which require the programming thereof for use by the PDL. The programming of a typical board is accomplished through the utilization of a blueprint having the wire paths drawn thereon or from a data base having the wire path configurations. A data base listing of wire number-to-unique path identification and a listing of discrete paths by initial and terminal end points is provided, as described below.

Figure 6:
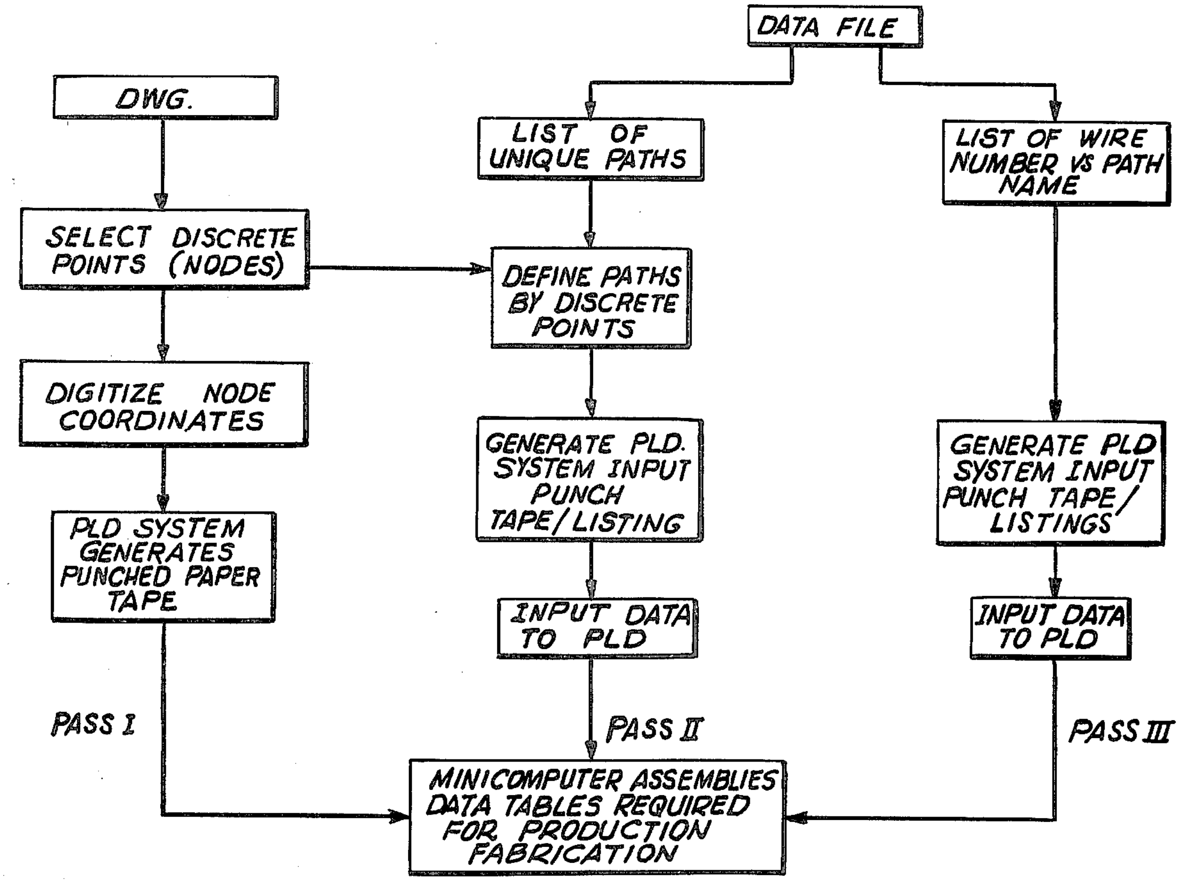
FIG. 6 is a programming flow diagram for the system.

With reference to FIGS. 5 and 6, the steps for programming a typical harness board will be described.

a. Pass I—Digitizing

Starting with a copy of the harness board drawing, sequential numbers are assigned to each of the critical breakouts e.g. (3)(5)(7)(17), and end-points, e.g. (1)(2)(10)(14)(20), etc., as shown in FIG. 5. The numbers represent discrete points (Node Numbers) which can be assembled into a string of points or a path. It must be remembered that the resultant motion will be in the form of straight-line segments to create a continuous path. Therefore, if a curvilinear motion is desirable, additional nodes would have to be added, as shown with points (23), (25), (27) and (28). One additional unique point (Node Number 0 or the Kit Point) must also be located. This is the board position that the system will always start from and return to. This node should be located as close as possible to the expected location of the kitted wire subassemblies. Once the harness board drawing has been sequentially numbered, it is ready for digitizing or path development.

Digitizing is the technqiue by which coordinates are assigned to points using manual placement and the reading of the coordinates by the minicomputer. Machine placement and inputs are controlled through the digitize control box 44, FIG. 4. Sequentially the light beam B is moved to each point via a joy stick control 44*a*. When the beam is at the desired node, the operator depresses an enter switch 44*b*. A coordinate pair is then assigned to the point upon the information from encoders 58 and 90. The node number is incremented and the next coordinates assigned until all are complete. At this point all node numbers and their associated coordinate pairs are stored by the CPU 40; the digitizing process or Pass I, FIG. 6, would be complete. A punched paper tape can then be made to serve as a permanent record and back-up, should re-loading of the PLD System become necessary. As an option, a previously prepared punched paper tape containing the node number and coordinate pair correlation can be utilized.

As an alternative to sequentially digitizing the nodes, the digitizing control 44 may be used to digitize in a "random" fashion. To this end the operator moves the beam to the desired node with joy stick 44*a* and manually enters the node number in manually settable register 44*c*, illustrated as set to note "323" in FIG. 4. The enter button 44*b* is pressed and the computer assigns the coordinates of the position of the beam to the node number set in register 44*c*.

b. Pass II—Path Definition

After all node points have been sequentially numbered for digitizing, path definitions are established. Working from data file, FIG. 6, a discrete path listing is generated. The data file contains wire groups (starting point) and "to" reference designations. Since this information describes both ends of each discrete path, it can also be used to name the path.

Sample path definitions including node points with reference to FIG. 5 are shown in Table I. A punched paper tape is made from the complete list of path definitions and inputted to the computer as Pass II. At this point the system assembles the path and node definitions into path names and a set of required coordinate pairs. Pass II is now complete.

Table I

| Group (Starting Point) | Designation | Node Numbers | Path Name |
|---|---|---|---|
| J | E | 24,23,16,15,26,13,12,11 | A/E |
| J | A | 24,23,16,7,6,5,3,1 | J/A |
| G | B | 21,19,18,17,16,7,6,5,3,2 | G/B |
| A | J | 1,3,5,6,7,16,23,24 | A/J |

c. Pass III—Wire/Path Assignment

The Pass III input is a punched paper tape relating a wire number to a path name which could be obtained directly from the data file. The system uses this data to relate a wire number which will be imprinted in bar code on each tag 34*a* to its unique set of coordinate pairs. A sample input list is shown in Table II. More than one wire can, of course, have the same path.

Table II

| Wire Number | Path Name |
|---|---|
| A511001 | A/E |
| 1006323 | J/A |
| M6396 | J/A |

Table II-continued

| Wire Number | Path Name |
|---|---|
| M352163 | G/B |

Once the harness board has been programmed as described above, the PLD is operative to direct a light beam from the starting point of a wire in the board along its path to the terminal point. To activate the system, a wire is selected and the tag 34*a* is scanned by the wand reader 34. The system identifies the wire and moves the light beam to the start location. Another scan of any wire and the light beam begins to trace out the path on the board. The operator places the end of the wire on the board at the start location and attaches the wire along the path traced by the light beam or connectors 26. The process is repeated for each wire until the entire harness is assembled on the board. A wire harness can have any number of wires and typically contains several hundred.

Motor Control

Figure 8:
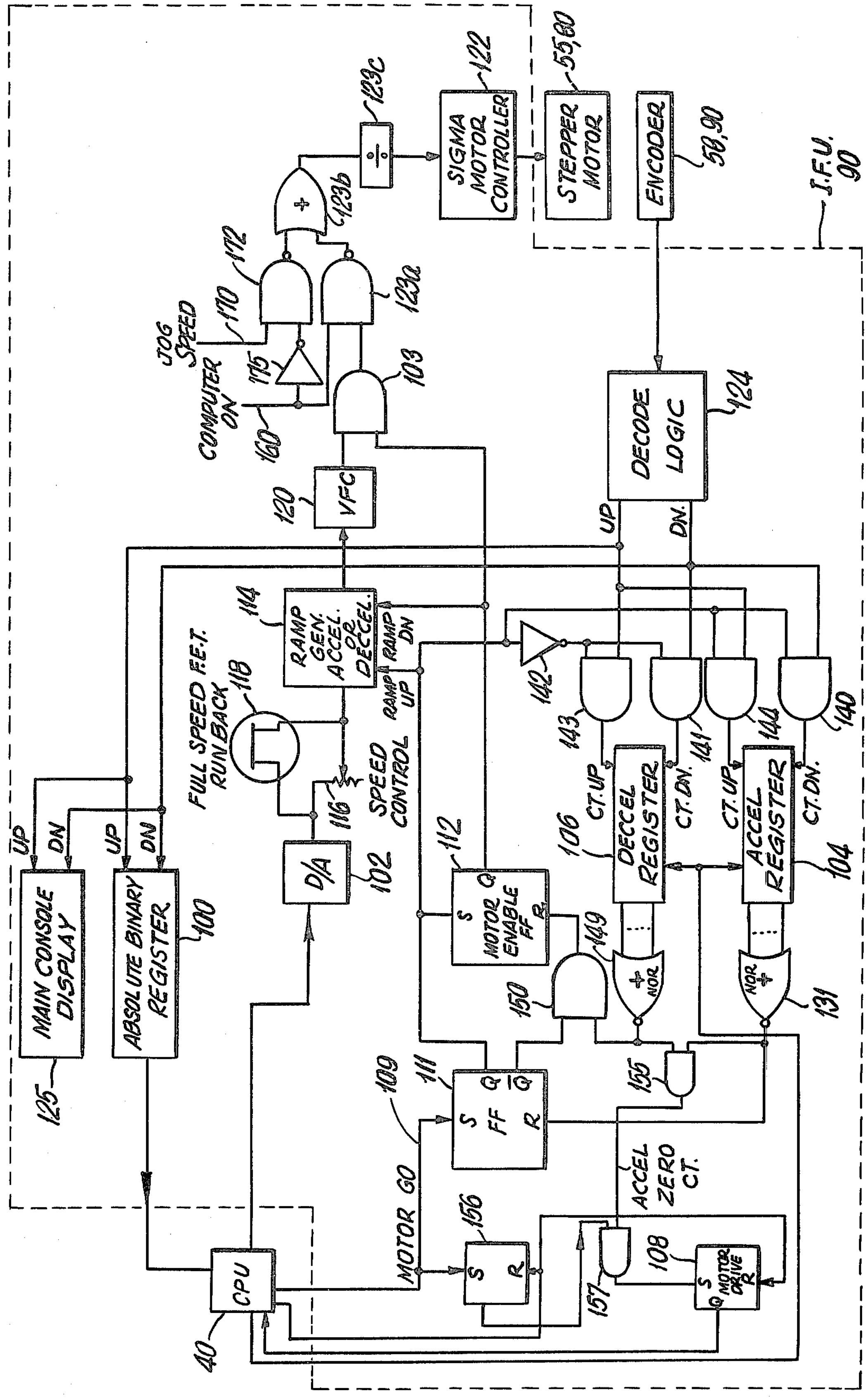
FIG. 8 is a motor control logic diagram.

The control of stepper motor 55 and 80 and encoders 58 and 90 is illustrated in FIG. 8. The control systems for each motor and its associated encoder is the same so that only one logic diagram is illustrated with the understanding that it is representative of both control circuit logic.

To move the light spot to a new position on the board the PLD System computer 40 compares the new coordinates to those it reads from the absolute binary registers 100. Alpha is a 12 bit register, while X is 16 bits. Calculations are performed by the computer (as described below) to calculate D/A settings (velocity), direction, acceleration counts, and deceleration counts for each axis. These values are loaded into the D/A 102, accel registers 104, and decel registers 106. The motor done flag skip flip flop 108 is cleared. The motor go command 109 is issued, and this sets the go flip flop 111 (and motor enable flip flop 112) for the axis if the related accel register 104 is non zero. The non zero state of accel register 104 is tested by NOR gate 131. The go flip flop 111 causes the ramp generator 114 for its axis to ramp up to the voltage being supplied by the speed control potentiometer 116, or D/A 102 output if the full speed run back 118 is enabled. The related VFC 120 output frequency then also increases, and is fed to the sigma controller 122 through the enabled gates 103, 123*a* and 123*b* and divider 123*c* to the motors 55, 80. The stepping rate of the motor then increases and accelerates the velocity of the movement of the light spot. The encoder 58, 90 which is mechanically connected to the stepper motor shaft, feeds back through the decode logic 124 and counts up or down the accel register 104 through AND gate 140 and register 100 and console display 125. The decode logic to AND gate 141 is blocked by the inverted signal through inverter 142. Count up input to AND gates 143, 144 is similarly controlled. For a positive motion the register counts up, negative motion down.

When the accel register 104 has gone to zero (or rolled over if counting up) the go flip flop 111 resets. This allows the motor enable flip flop 112 to start deceleration of the VFC 120, if the decel register 106 is non zero. The non zero state of decel register 106 is tested by NOR gate 149, which cooperates with $\overline{Q}$ of flip flop 111 to reset motor enable flip flop 112 through AND gate 150 when decel register 106 is zero. Thus, encoder 58, 90 feeds back the motor's motion and now counts up or down the decel register 106. When decel register 106 goes to zero the enable flip flop 112 resets and removes the pulse stream from the sigma controller, stopping the motor. Motor done flip flop 108 for an axis is set either of two ways:

(1) If the accel and decel registers 104, 106 are zero, when the motor go command is done. One states from gates 131 and 149 are ANDED in gate 155 to determine that both registers 104, 106 are at zero. Flip flop 156 is ANDED with the output of gate 155 in gate 157 to set the motor done flip flop.

(2) If the accel and decel registers 104, 106 go to zero, after a motor go command. This is accomplished through gates 155 and 157 as just described.

The two motor done flip flops are "anded" to generate a single input to the CPU. The computer then uses this signal as a flag to indicate a completed move.

The motor control system is operative when a Computer On Signal 160 is presented by the interface hardware to AND gate 123*a*. Alternatively, motor 55, 80 may be controlled manually by joy stick 44*a*, which provides a jog speed input 170 to AND gate 172. The Computer On Signal 160 prevents manual operation through inverter 175, if manual operation is attempted during computer control.

Computer Calculations

The calculations for the D/A (velocity), direction and acceleration counts and deceleration counts for each axis are a function of certain design parameters. Disclosed below are illustrative calculations formula for the design parameters selected. Modifications thereto may be made by those skilled in the art to take into account different design parameters.

a. Velocity

To maintain approximately constant velocity along the light path $=V_{max}$ (max speed $=8.33$ in/sec), each axis (alpha and X) requires a separate velocity (D/A) setting.

The relationship between the velocities ($V_x$ and $V_a$) is as follows:

$$V_x = V_{max} \cos B$$

$$V_a = V_{max} \sin B$$

$$V_{max} = (V_x^2 + V_a^2)^{\frac{1}{2}} \quad \text{(Eq. 1)}$$

Where B is the angle between the X-axis and the linear direction of travel for the light beam.

The distance each axis must move ($D_x$ and $D_\alpha$) is calculated by the computer 40 as follows:

Where the initial position coordinates are read from the absolute binary registers 100, and the final position coordinates are obtained from the Pass I (digitized) data.

For "x":

$D_x$ (inches) $=(0.0199)$ (in/step) (Final coordinate in counts $-$ initial coordinate in counts).

The alpha axis distance is calculates by a two-step process due to the non-linear characteristic of alpha-axis motion. The first step is to find the distance from set point to initial position, and then to find the distance from set point to final position using equation 3, below. Once these two distances are obtained, then $D_\alpha$ (inches)=(Distance of Final Position−Distance of initial position)

Figure 9:
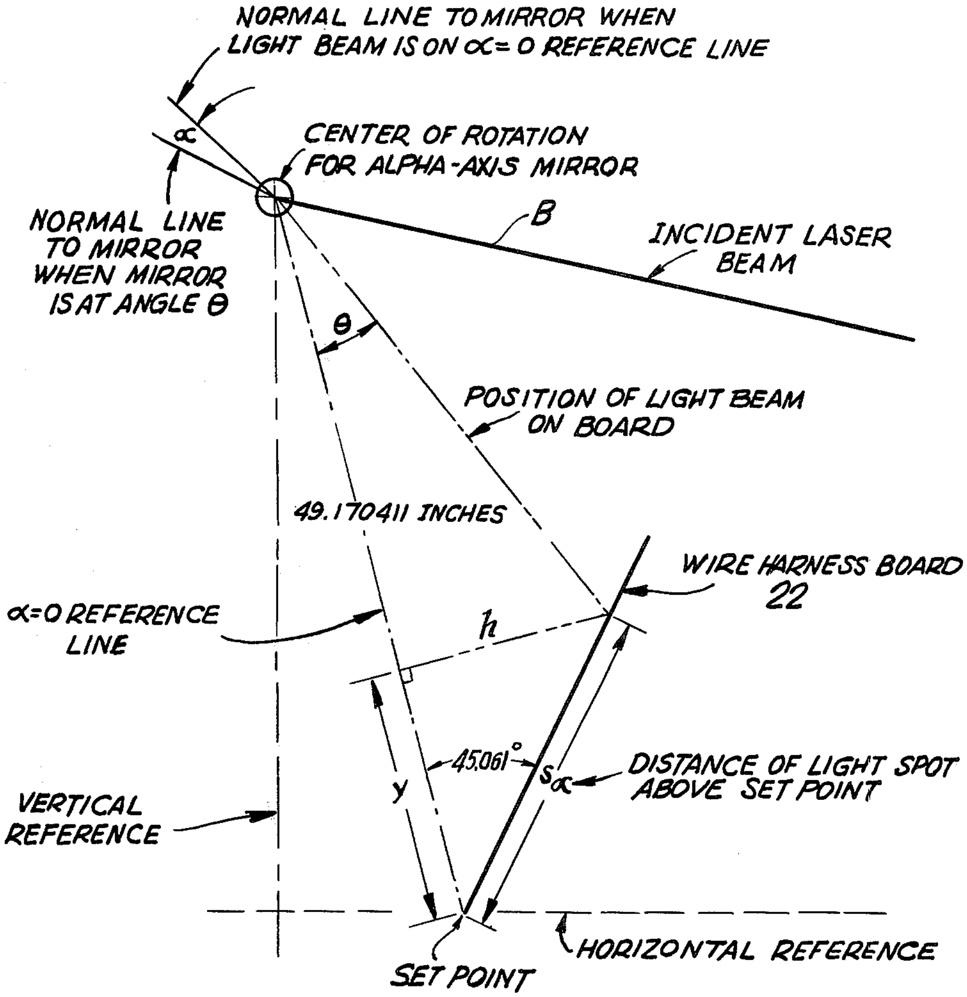
FIG. 9 is an illustration of the geometry used in calculations for the angular control of the beam.

The alpha distances are calculated with the following relationship, which are developed with reference to the geometry shown in FIG. 9.

Assumptions:

$\alpha=0$ reference line. Is path of beam when light spot is located; a defined Set Point Angle of rotation of the light beam is twice the angle of rotation of the mirror $2\alpha=\theta$ Length of $\alpha=0$ reference line from center of mirror to set point location is measured to be 49.170411 inches.

Derivation:

Let $S_\alpha$=vertical distance in inches from set point to light spot location h=altitude drawn from light spot location to=0 reference line $$\tan\theta = \frac{h}{(49.170411 - y)} \longrightarrow h = \tan\theta\,(49.170411 - y)$$

$$\sin(45.061°) = \frac{h}{S\alpha}$$

therefore: $S_\alpha \sin(45.061°)=\tan\theta(49.170411=y)$

Thus:

$$S\alpha = \frac{(49.170411 - y)\tan\theta}{\sin(45.061°)} \quad \text{(Eq. 2)}$$

and $$\cos(45.061°) = \frac{y}{S\alpha} \qquad y = S\alpha\cos(45.061°)$$

From Eq. 1 above:

$$S\alpha = \frac{(49.170411 - S\cos(45.061°))\tan\theta}{\sin(45.061°)}$$

Substituting the values for sine and cosine of 45.061° and clearing the equation yields:

$$S\alpha = \frac{69.4635\tan\theta}{(1 + (.997873)\tan\theta)}$$

Substituting $\theta=2\alpha$ and clearing yields:

$$S\alpha = \frac{69.4635\sin 2\alpha}{\cos 2_x + (.997873)\sin 2\alpha}$$

Let N=number of steps of encoder from set point to light spot location. Since encoder shaft rotates 1.8°/step, mirror/encoder gear ratio 42/6600, therefore mirror rotation relation to N is:

$\alpha=0.011454$ N hence $$S\alpha = \frac{69.4635\sin(.022908N)}{\cos(.022908N) + (.997873)\sin(.22908N)}$$

in radians $$S\alpha = \frac{69.4635\sin(3.998339\times10^{-4}XN)}{\cos(3.998339\times10^{-4}XN) + (.997873)\sin(3.998339\times10^{-4}XN)} \quad \text{(Eq. 3)}$$

The distance the light spot must move is then $D=(D_x^2 \text{ and } D_\alpha^2)^{\frac{1}{2}}$ are known The angle between the x axis and the light spot path (B) is therefore dependent upon $D_\alpha$ and $D_x$.

$\sin(B)=D_\alpha/D$ or $\cos(B)=D_x/D$ (Eq. 4)

therefore, from equation 1 and equation 4:

$$V_x = V_{max}\frac{D_x}{D} \text{ or } \frac{V_x}{V_{max}} = \frac{D_x}{D}\ (V_{run} \text{ for } X\text{-axis}) \quad \text{(Eq. 5)}$$

$$V = V_{max}\frac{D_\alpha}{D} \text{ or } \frac{V_\alpha}{V_{max}} = \frac{D_\alpha}{D}\ (V_{run} \text{ for Alpha-axis})$$

The PLD system uses a normalized velocity for setting the D/A's, that is, D/A setting of 1023 corresponds to an axis velocity equal to $V_{max}$. This permits the hardware velocity control potentiometers 116 to set each axis maximum velocity capability independent of the software program.

The x-D/A setting is then $(V_x/V_{max})$x-1023 (necessary for ranging)

Which is calculated by substituting Eq. 5.

$X\ D/A=(D_x/D)^*1023$ and similarly for alpha alpha $D/A=(D/D_\alpha)^*1023$ b. Direction The direction settings for each axis are the result of the distance calculation above.

c. Acceleration and Deceleration Counts

Acceleration and deceleration of the x-axis motor is necessary to prevent stalling and vibration. To keep the light spot motion uniform each axis is accelerated or decelerated at the same rate.

To calculate the deceleration counts required, the assumption is made that the light spot would undergo the same acceleration/deceleration rates as each individual axis. The light spot would reach a velocity of $V_{max}$, where each of the axes would only reach a velocity ($V_{run}$) as defined above.

Additionally it was determined that if the velocity attained by light spot before start of deceleration was less than ⅓ of $V_{max}$ then no deceleration would be required. This was determined to be a total move distance of the light spot of less than 0.8 inch. Derivation of equations defining the movement of the carriage is described below.

Assumptions:

Each motor (and axis) will be accelerated to its running velocity. The axis velocity (for acceleration) is defined by:

$$V(t)=V_{run}(1-e^{-t/K1})$$

where $V_{run}$ = the speed required of each axis to move the light spot at a velocity = 8.33 in./sec ($V_{max}$) $K_1$ = a constant = 0.305 $sec^{-1}$ (determined by an RC combination on the motor control card)

Each motor (and axis) will be decelerated to less than (0.3) (8.33) in./sec., and then shut off entirely. The axis velocity (for deceleration) is defined by:

$$V(t)=V(T_1)e^{(T1-t)/K2}$$

where $T_1$ is time at start of deceleration, $V(T_1)$ is determined from acceleration velocity equation. $K_2$ = a constant = 0.255 $sec^{-1}$ (determined by an RC combination on the motor control card).

Running Velocities ($V_{run}$) for each axis as determined above:

$$V_{run} = \left(\frac{\text{Distance of } \alpha \text{ move}}{\text{Distance of light to move}}\right)^{*} (V_{max})$$

$$= \left(\frac{D_\alpha}{D}\right) (V_{max})$$

$$V_{run\,x} = \left(\frac{\text{Distance of } X \text{ move}}{\text{Distance of light to move}}\right)^{*} (V_{max})$$

$$= \left(\frac{D_X}{D}\right) (V_{max})$$

also $D=(DU_\alpha^2+DU^2)^{\frac{1}{2}}$ $V_{max}$ = Maximum light beam speed = 8.33 in./sec Velocity Relationships Derivation of velocity equations for light beam assume at time = $T_1$ light beam starts deceleration = $T_2$ motor shuts off entirely then for $t \geqq T_1$:

$$V_x(t)e = V_x(T_1)e^{(T1-t)/K2}$$

$$V_\alpha(t)e = (V_\alpha(T_1)e^{(T1-t)/K2}$$

$$V_{light}(t) = (V_x^2 + V_\alpha^2)^{\frac{1}{2}} = (V_x^2(T_1) + V_\alpha^2(T_1)^{\frac{1}{2}}e^{(T1-t)/K2}$$

then:

$$V_x(T_1) = V_{runx}(1 - e^{-T1/K1}) = \left(\frac{D_x}{D}\right) V_{max}(1 - e^{(T1/K1)})$$

likewise:

$$V_\alpha(T_1) = \frac{D_\alpha}{D} V_{max}(1 - e^{-T1/K1})$$

$$V_{light}(t) = e^{(T1-t)/K2}\left[\left(\frac{D_\alpha}{D} V_{max}\right)^2 + \left(\frac{D_x}{D} V^2_{max}\right)^2\right]^{\frac{1}{2}} (1 - e^{-T1/K1}) =$$

$$(e^{(T1-t)/K2})(1 - e^{-T1/K1}) V_{max}\left(\frac{D_\alpha^2 + D_x^2}{D^2}\right)^{\frac{1}{2}} = V_{max}(1 - e^{-T1/K1})e^{(T1-t)/K2}$$

letting:

$$V_{light}(T_1) = V_{max}(1 - e^{-T1/K1})$$

then for $t \geqq T_1$:

$$V_{light}(t) = V_{light}(T_1)(e^{(T1-t)/K2})$$

This equation is of the same form as the driving equations for each individual axis, except that $V_{run}$ has been replaced by $V_{max}$ = 8.33 in./sec. (a constant).

To find the distance traveled by the light beam:

Assume at time = $T_2$ the motors shut off. This time is determined such that the light beam speed is $\leqq(0.3)\times(8.33)$ in./sec. This guarantees that each individual axis velocity is also $\leqq(0.3)$ (8.33) in./sec., and therefore is the safe start stop region for the stepper motors.

$$D_{light}(t) = \int_{0_{accel}}^{T_1} V(t)\,dt + \int_{T_{1decel}}^{T_2} V(t)\,dt$$

where:

$T_1$ = time at start of decel $T_2$ = time at which light beam speed = (0.3) (8.33) in./sec. that is $V(T_2)=(0.3)\ V_{max}$ $$D_{light}(t) = \int_0^{T_1} V_{max}(1 - e^{-t/K1})\,dt + \int_{T_1}^{T_2} V(T_1)e^{(T1-t)/K2}\,dt$$

$$= V_{max}(T_1 + K_1(e^{(-T1/K1)} - 1)) + V(T_1)[(-K_2)(e^{(T1-T2)/K2-1})$$

$$= V_{max}(T_1 - K_1(1 - e^{-T1/K1})) + K_2(V(T_1)(1 - e^{(T1-T2)/K2})$$

The above equation was solved for arbitrary values of $T_1$ (from 0.12 to 1.0 seconds in steps of 0.02 seconds). This allowed the determining of values of $T_2$ such that:

$V_{light} \leqq (0.3)\times(8.33)$ when the motors shut off.

Curve fitting the values of $T_2$ vs distance moved resulted in an equation of the form:

$$\text{Decel distance } (DD)=1.519-a(e)^{-0.40596*D}$$

and experimentally the value of "a" was determined to be 0.5.

Therefore the necessary light beam deceleration distance for a given total light spot move distance can be found from the equation:

$$DD=1.519-0.5e^{-0.40596*D} \quad \text{(Eq. 6)}$$

The alpha and X deceleration distances can be calculated since the same relationship holds between decel distances, as does between total move distances.

That is:

$$\text{Decel distance (Alpha)}=DD^*(D_\alpha/D)$$

$$\text{Decel distance } (X)=DD^*(D_x/D)$$

The method the computer uses to calculate accel counts and decel counts is as follows:

If the total distance the light spot is to move (D) is $\leqq 0.8$ inches, then no decel is required.

If greater than 0.8 inches, then:

Calculate the decel distance of the light beam (DD)

$$DD=1.519-0.5e^{-0.40496*D}$$

Find X decel distance ($DD_x$)

$$DD_x=DD^*D_x/D \text{ (inches)}$$

Find alpha decel distance ($DD_\alpha$)

$$DD_\alpha=DD^*D_\alpha/D$$

Find X decel counts by:

$$X \text{ decel counts} = \frac{DD_x}{(.0199)\left(\frac{\text{inches}}{\text{steps}}\right)}$$

Find alpha decel counts by:

—finding the decel start location on the board as referenced to the set point.

Decel start loc=alpha final position (inches)-−alpha decel distance ($DD_\alpha$)

—solving Equation 3 for N (number of motor/encoder steps):

$$N = \left(\frac{1}{.022908}\right) \tan^{-1}\left(\frac{S_\alpha}{69.4635 - (.997873)\, S_\alpha}\right)$$

and substituting for $S_\alpha$, the start location of the alpha deceleration.

This results in the number of counts from the set point that alpha deceleration starts.

The alpha decel counts then is

Decel counts=Alpha new coordinate (incounts)-−Alpha decel start location in counts.

What is claimed is:

1. A programmable light director system for randomly routing wires on a harness board comprising:

(i) light source means for generating a light beam;

(ii) two-axis control means operative with said light source means for controlling the projection of said light beam on said harness board;

(iii) central processor means operatively coupled to said two-axis control means to generate command signals thereto from predetermined wire path data base to cause said two-axis control means to move the light beam continuously along a wire path in response thereto, said central processor means including scanning wand input means for automatically identifying each of said wires to be routed, said central processor means further including digitizing means for assigning coordinates to the points comprising said wire path.

2. A programmable light director of claim 1, wherein said two-axis control means includes means for controlling the linear position of said light beam relative to said harness board.

3. A programmable light director of claim 2, wherein said two-axis control means includes means for controlling the angular position of said light beam relative to said harness board.

4. A programmable light director of claim 1, wherein said two-axis control means includes means for controlling the angular position of said light beam relative to said harness board.

5. A programmable light director of claim 1, wherein said light source means includes a light source arranged to generate a light beam along a first path portion; and rotatable reflector means located at the end of said first path portion; and said two-axis control means includes means for rotating said reflector means.

6. A programmable light director of claim 5, wherein said light source includes a laser and collimating means.

7. A programmable light director of claim 5, further including carriage means carrying said light source means; and said two-axis control means includes means for moving said carriage means longitudinally of said harness board.

8. A programmable light director of claim 7, wherein said reflector means is arranged to cause said beam to scan the harness board transversely.

9. A programmable light director system for randomly routing wires for a wire harness comprising:

(i) a harness board;

(ii) carriage means mounted for translation relative to said harness board;

(iii) motor means under the control of central processor means for moving said carriage;

(iv) a light beam assembly mounted on said carriage means, said light beam assembly including a light source arranged to generate a light beam continuously along a first path portion; rotatable reflector means located at the end of said first path portion; and means for rotating said reflector means such that said light beam may be reflected from said first path portion onto said harness board.

10. A light director system of claim 9, wherein said light source includes a laser and collimating means.

11. A light director system of claim 9, wherein said carriage means is mounted for translation along an edge of said harness board.

12. A light director system of claim 11, wherein said reflector means is arranged to cause said light beam to scan said board transversely.

13. A light director system of claim 9, wherein said first path portion is an upwardly directed path portion.

14. A light director system of claim 9, wherein said harness board is arranged at an inclined plane to the horizontal.

15. A light director system of claim 9, further including means for mounting said light beam assembly on said carriage means for rotation of the light assembly in the horizontal plane.

16. A light director system of claim 9, wherein said reflector means includes a flat reflector surface.

17. A light director system of claim 16, wherein said reflector means is a mirrored surface.

18. A method of randomly routing wires on a wire harness board comprising the steps of:

identifying automatically each of said wires to be routed; providing a predetermined harness pattern having a plurality of wire paths;

assigning numbers to a plurality of points along the harness pattern including the end points thereof;

digitizing each of said points to form a (1) point number coordinate data set;

compiling a (2) wire path data set for each of said wire paths from said assigned point numbers such that each of said number sets progresses from the initial to terminal number of its associated path;

providing a (3) discrete wire identification-path data set relating each wire to an associated path data set;

utilizing data sets (1), (2) and (3) to identify a discrete wire for routing in the harness, assign the identified wire to a path data set, and to sequentially transform the path data set numbers into coordinates, and moving a light beam continuously along the coordinates to trace out the path of each wire on said harness board.

19. A method of directing a light beam onto a surface to display a continuous light point path comprising the steps of:

(i) moving a light source along a path relative to said surface;

(ii) directing a beam from said source along a first path portion;

(iii) reflecting said beam at the end of said first path portion with a reflector;

(iv) rotating said reflector to cause said beam to be reflected along any one of a plurality of second path portions determined by the angle between said first path portion and said reflector; and (v) correlating the linear movement of the light source with the rotation of said reflector, whereby two-axis control of said light beam is achieved.

20. A method of claim 19, wherein said first light path is an upwardly inclined path.

21. A method of claim 19, wherein said light source is moved along a linear path relative to said surface.

* * * * *